(12) United States Patent
Okada

(10) Patent No.: US 8,988,351 B2
(45) Date of Patent: Mar. 24, 2015

(54) INPUT DEVICE, AND ELECTRONIC APPARATUS PROVIDED WITH SAME

(75) Inventor: Takashi Okada, Kawasaki (JP)

(73) Assignee: NEC Casio Mobile Communications, Ltd., Kanagawa (JP)

( * ) Notice: Subject to any disclaimer, the term of this patent is extended or adjusted under 35 U.S.C. 154(b) by 213 days.

(21) Appl. No.: 13/819,554

(22) PCT Filed: Aug. 25, 2011

(86) PCT No.: PCT/JP2011/069195
§ 371 (c)(1),
(2), (4) Date: Feb. 27, 2013

(87) PCT Pub. No.: WO2012/029633
PCT Pub. Date: Mar. 8, 2012

(65) Prior Publication Data
US 2013/0154942 A1 Jun. 20, 2013

(30) Foreign Application Priority Data
Aug. 30, 2010 (JP) .................. 2010-192693

(51) Int. Cl.
*G09G 5/08* (2006.01)
*G06F 3/02* (2006.01)
*G06F 3/0338* (2013.01)
*G06F 3/0354* (2013.01)
*H03K 17/97* (2006.01)

(52) U.S. Cl.
CPC ............... *G06F 3/02* (2013.01); *G06F 3/0338* (2013.01); *G06F 3/0354* (2013.01); *H03K 17/97* (2013.01); *H01H 2239/01* (2013.01); *H01H 2239/024* (2013.01)
USPC .......................... 345/160; 345/156

(58) Field of Classification Search
CPC . G06F 3/0338; G06F 3/0354; G06F 3/03541; G06F 3/03543; G06F 3/03544
USPC ............ 345/156, 157, 160, 161, 163
See application file for complete search history.

(56) References Cited

U.S. PATENT DOCUMENTS

| | | | |
|---|---|---|---|
| 6,747,631 B1* | 6/2004 | Sakamaki et al. | 345/161 |
| 8,681,092 B2* | 3/2014 | Harada et al. | 345/156 |
| 2004/0124717 A1* | 7/2004 | Corcoran et al. | 345/161 |

FOREIGN PATENT DOCUMENTS

| | | | |
|---|---|---|---|
| JP | 2003-196019 A | 7/2003 |
| JP | 2005-004365 A | 1/2005 |
| JP | 2005-100179 A | 4/2005 |
| JP | 2005-107672 A | 4/2005 |

OTHER PUBLICATIONS

International Search Report for PCT/JP2011/069195, dated Nov. 8, 2011.

* cited by examiner

*Primary Examiner* — Regina Liang
(74) *Attorney, Agent, or Firm* — Sughrue Mion, PLLC

(57) ABSTRACT

An input device includes a substrate, a key top, a magnet, magnetic sensors, and electromagnetic converters. The substrate includes first and second surfaces. The key top is arranged on a first surface side, slides from a reference position in directions parallel to the substrate, and moves in a perpendicular direction. The magnet is fixed on a substrate side, and moves together with the key top. The magnetic sensors are fixed on the second surface, are respectively arranged apart in different directions parallel to the substrate, and detect a position of the magnet. The electromagnetic converters are fixed on the second surface, are respectively arranged apart in different directions parallel to the substrate, are arranged at positions different from the magnetic sensors, and generate magnetic force in a direction in which the magnet is away from the substrate in the perpendicular direction, in accordance with a supply of electrical power.

10 Claims, 6 Drawing Sheets

INPUT DEVICE, AND ELECTRONIC APPARATUS PROVIDED WITH SAME

CROSS REFERENCE TO RELATED APPLICATIONS

This application is a National Stage of International Application No. PCT/JP2011/069195, filed on Aug. 25, 2011, which claims priority from Japanese Patent Application No. 2010-192693, filed Aug. 30, 2010, the contents of all of which are incorporated herein by reference in their entirety.

TECHNICAL FIELD

The present invention relates to an input device of an electronic apparatus, and an electronic apparatus.

BACKGROUND ART

An electronic apparatus is provided with various input devices in order to accept inputs by a user.

As an input device of an electronic apparatus, Patent Document 1 discloses an input device that indicates the position of a pointer that is shown on a display, and imparts a stimulation to an operator in accordance with an operation content. This input device includes a substrate, a plurality of magnetic sensors, a key top, a permanent magnet, a moving coil, and a stimulation member. The plurality of magnetic sensors are fixed to one surface of the substrate. The key top is arranged on the one surface side of the substrate to be capable of tilting in various directions. The permanent magnet is provided on the substrate side of the key top to be relatively immovable with respect to this key top. The moving coil is arranged between the permanent magnet and the key top to be capable of moving to and fro with respect to them. The stimulation member is fixed to the key top side of the moving coil. A through hole is formed in the center portion of the key top. A convex portion that is capable of projecting out through the through hole of the key top is formed in the stimulation member.

In this input device, as a result of the operator causing the key top to tilt in any direction, the permanent magnet that is provided in this key top so as to be relatively immovable tilts in that direction together with the key top, and the plurality of magnetic sensors detect the tilting of this permanent magnet in each direction. This detection result is reflected in the position of the pointer that is shown on the display. Also, by passing electrical current through the moving coil to generate a magnetic force in this input device, the moving coil is made to move in a direction retreating from the permanent magnet, and the convex portion of the stimulation member that is fixed to this moving coil is made to project from the through hole of the key top, and impart a stimulation to the operator.

PRIOR ART DOCUMENT

Patent Document

[Patent Document 1] Japanese Unexamined Patent Application, First Publication No. 2005-100179

SUMMARY OF THE INVENTION

Problem to be Solved by the Invention

In the art that is disclosed in the aforementioned Patent Document 1, it is possible to indicate the position of a pointer, and it is possible to impart a stimulation to an operator. However, since the magnetic sensors, the permanent magnet, the moving coil, the stimulation member, and the key top are arranged in an overlapping manner on one surface side of the substrate, there is the problem of the thickness of the input device being increased. This problem becomes an extremely important problem in the case of electronic apparatuses in which portability is required, such as mobile phones or portable information processors and the like.

Therefore, an exemplary object of the present invention is to provide an input device that can achieve a reduction in thickness, and an electronic apparatus including it.

Means for Solving the Problem

In order to solve the aforementioned issues, an input device according to the present invention includes a substrate, a key top, a magnet, a plurality of magnetic sensors, and a plurality of electromagnetic converters. The substrate includes a first surface and a second surface on a opposite side of the first surface. The key top that is arranged on a first surface side of the substrate, slides from a reference position on the substrate in a plurality of directions parallel to the substrate, moves in a perpendicular direction with respect to the substrate. The magnet is fixed on a substrate side of the key top, and moves together with the key top. The magnetic sensors are fixed on the second surface of the substrate, are respectively arranged apart in different directions parallel to the substrate centered on the reference position, and detect a position of the magnet that moves accompanying sliding of the key top. The electromagnetic converters are fixed on the second surface of the substrate, are respectively arranged apart in different directions parallel to the substrate centered on the reference position, are arranged at positions different from the magnetic sensors, and generate magnetic force in a direction in which the magnet is away from the substrate in the perpendicular direction, in accordance with a supply of electrical power.

Also, An electronic apparatus according to the present invention includes the above input device, a display, and an arithmetic circuit calculates a coordinate of pointer that is shown on the display in accordance with outputs of the plurality of magnetic sensors.

Effect of the Invention

According to an exemplary embodiment of the present invention, it is possible to indicate the position of a pointer, and it is possible to impart various stimulations to an operator. Moreover, in the exemplary embodiment of the present invention, movement of the key top for indicating the position of the pointer is two-dimensional movement that is parallel to the substrate, and moreover the magnetic sensors and magnetic converters are arranged in a two-dimensional manner on the other lower surface. With this constitution, it is possible to reduce the thickness of the input device.

EMBODIMENTS FOR CARRYING OUT THE INVENTION

Hereinbelow, an input device according to an exemplary embodiment of the present invention and an electronic apparatus including it shall be described with reference to the drawings.

Figure 5:
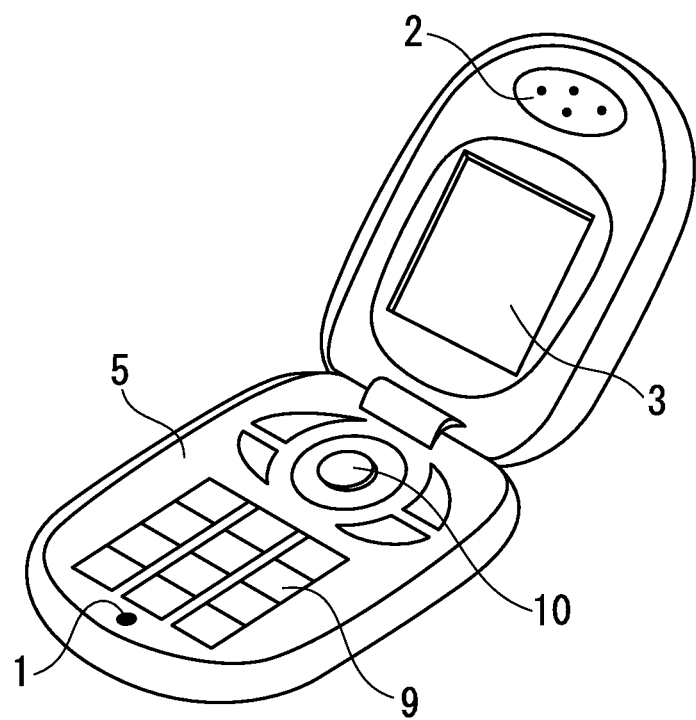
FIG. 5 is a perspective view that shows a mobile phone according to the exemplary embodiment of the present invention.

The electronic apparatus according to the present exemplary embodiment, as shown in FIG. 5, may be a mobile phone. This mobile phone includes a microphone 1, a speaker 2, a display 3, a communication device (not shown), various input devices 9 and 10, and a housing 5 in which these are mounted.

The input devices 9 and 10 that are mounted in this mobile phone include a keyboard 9 for inputting characters and commands, a pointing device 10 for indicating the position of a pointer that is shown on the display 3, and the like.

Figure 1:
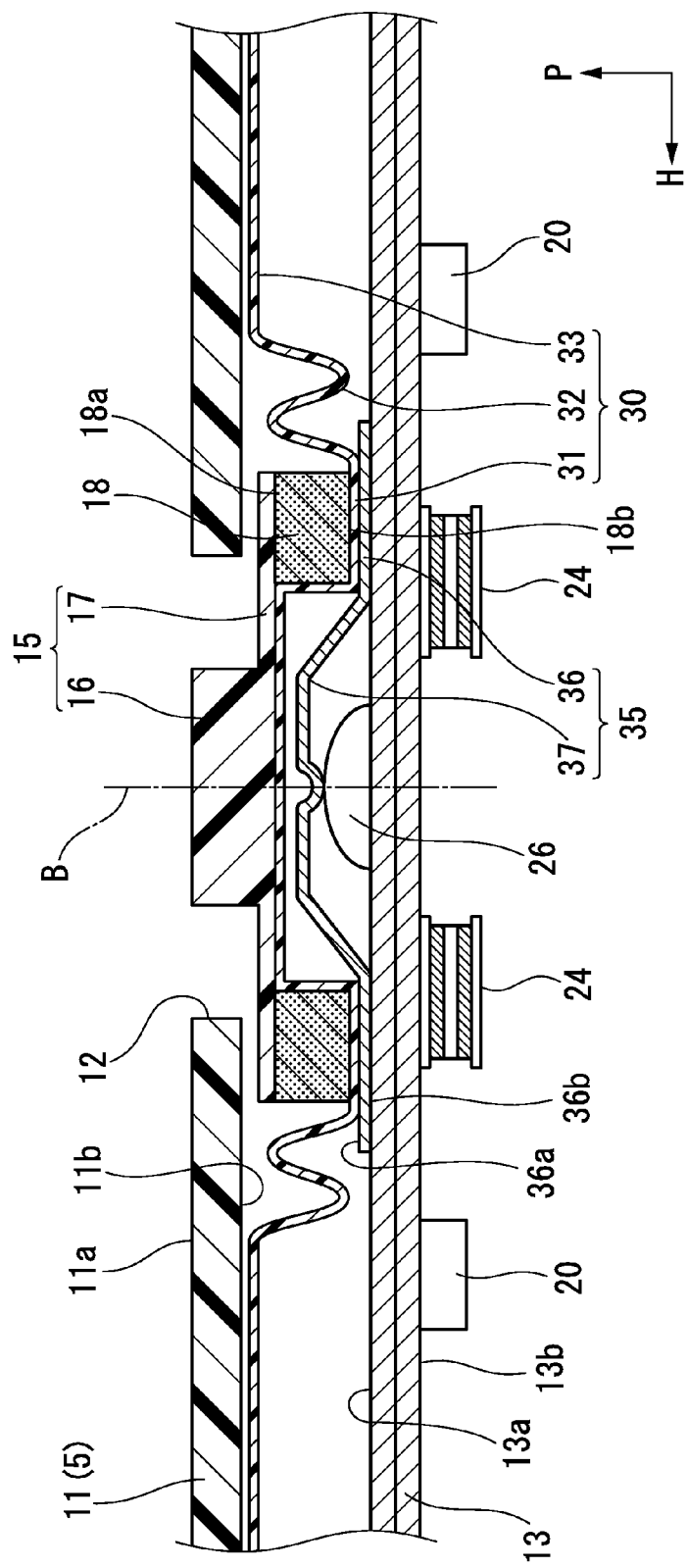
FIG. 1 is a cross-sectional view of an input device according to one exemplary embodiment of the present invention.

As shown in FIG. 1, the pointing device 10 that is one of the input devices includes a top plate 11, a substrate 13, a key top 15, a permanent magnet 18, four magnetic sensors 20, four electromagnetic coils 24, a decision switch 26, a resilient member for sliding 30, and a resilient member for selection 35.

The top plate 11 forms a portion of the housing 5. The substrate 13 is arranged to be parallel with the top plate 11 in the housing 5. The key top 15 is arranged to be slidably movable in any direction (horizontal direction) H that is parallel to this substrate 13, and liftably movable in a perpendicular direction (away/toward direction) P that is perpendicular to the substrate 13. The permanent magnet 18 is provided to be relatively immovable with respect to the key top 15. The four magnetic sensors 20 detect movement of the permanent magnet 18 in the sliding direction H accompanying sliding of the key top 15. The four magnetic coils 24 generate magnetic force that causes the permanent magnet 18 to move in the perpendicular direction P. The decision switch 26 outputs a low/high signal in accordance with movement of a portion of the key top 15 in the perpendicular direction P. The resilient member for sliding 30 resiliently deforms in accordance with the sliding of the key top 15. The resilient member for selection 35 resiliently deforms in accordance with movement of the portion of the key top 15 in the perpendicular direction P.

The key top 15 has a cylindrical contact portion 16 that the operator touches, and a disc-shaped support portion 17 that supports this contact portion 16. The outer diameter of the support portion 17 is larger than the outer diameter of the contact portion 16. The center axis of the support portion 17 and the center axis of the contact portion 16 are in agreement. The contact portion 16 and the support portion 17 are integrally formed with resin. The contact portion 16 is displaced in a direction that is parallel with the center axis of the contact portion 16 by resilient deformation of the support portion 17 made of resin. The aforementioned portion of the key top 15 refers to this contact portion 16.

The permanent magnet 18 is a ring-shaped magnet that has a ring shape. One end surface (hereinbelow referred to as the upper end surface) 18a side of the permanent magnet 18 constitutes the S pole, while the other end surface (hereinbelow referred to as the lower end surface) 18b side constitutes the N pole. The outer diameter of this permanent magnet 18 is substantially the same as the outer diameter of the support portion 17 of the key top 15. The inner diameter of this permanent magnet 18 is larger than the outer diameter of the contact portion 16 of the key top 15. The key top 15 is adhered to the upper end surface of the permanent magnet 18, so that the center axis of this permanent magnet 18 and the center axis of the key top 15 are in agreement. For this reason, when the contact portion 16 of the key top 15 is pushed by the operator, a portion enters the ring of the permanent magnet 18.

Figure 2:
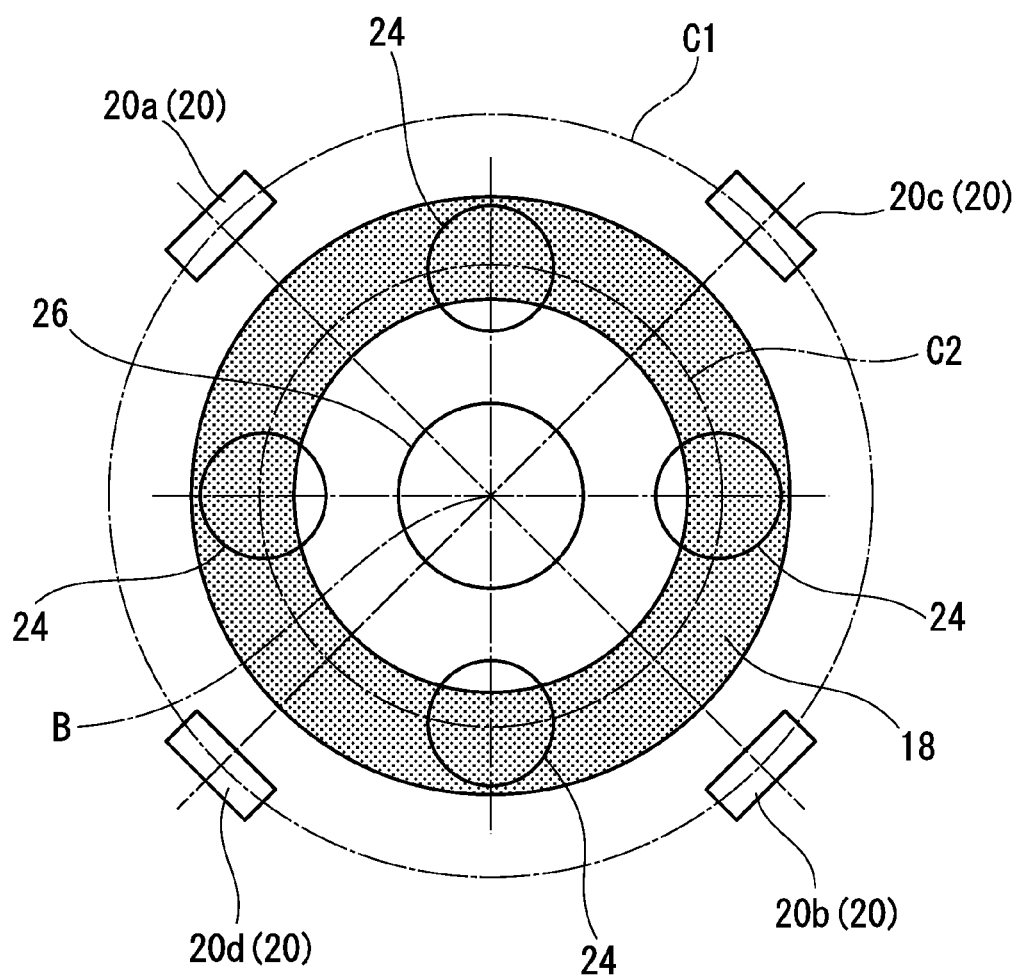
FIG. 2 is an explanatory view that shows a plan-view arrangement of a permanent magnet, electromagnetic coils, and magnetic sensors that constitute the input device according to the exemplary embodiment of the present invention.

The decision switch 26 is fixed on the one surface (hereinbelow referred to as the upper surface) 13a on the top plate 11 side of the substrate 13. This decision switch 26 is positioned on the reference position B of the substrate 13 that is determined in advance. Also, the four magnetic sensors 20 and the four electromagnetic coils 24 are fixed on the other surface (hereinbelow referred to as the lower surface) 13b of the substrate 13. The four magnetic sensors 20 are positioned at mutually equivalent intervals on a first circumference C1 that is centered on the reference position B, as shown in FIG. 2. The four magnetic coils 24 arranged at mutually equivalent intervals on a second circumference C2 that is centered on the reference position B. The diameter of the first circumference C1 is larger than the outer diameter of the permanent magnet 18. The diameter of the second circumference C2 is smaller than the outer diameter of the permanent magnet 18. The diameter of the second circumference C2 is set so that the four electromagnetic coils 24 that are fixed on this second circumference C2 overlap with the permanent magnet 18 that exists at the reference position B. The permanent magnet 18 or the key top 15 existing on the reference position B means that the respective center axes exist on the reference position B.

As shown in FIG. 1, a circular opening 12 is formed at a portion of the top plate 11 that corresponds to the reference position B of the substrate 13. The diameter of this circular opening 12 is greater than the outer diameter of the contact portion 16 of the key top 15, and smaller than the outer diameter of the support portion 17 of the key top 15.

The resilient member for sliding 30 has a circular inner portion 31, a resilient portion 32 that is formed along the outer circumference of the inner portion 31, and an outer portion 33 that is formed along the outer circumference of the resilient portion 32. This resilient member for sliding 30 is for example formed with a sheet-like resin that is capable of resilient deformation, such as silicon rubber. The outer diameter of the inner portion 31 is substantially the same as the outer diameter of the support portion 17 of the key top 15 and the outer diameter of the permanent magnet 18. The resilient portion 32 is formed by folding back a portion of the resin sheet in a zigzag manner so that the amount of resilient deformation increases.

The inner portion 31 of the resilient member for sliding 30 is affixed to the lower end surface 18b of the permanent magnet 18. The outer portion 33 is affixed to the lower surface 11b of the top plate 11 so that the permanent magnet 18 and the key top 15 are positioned on the reference position B of the substrate 13 when the resilient portion 32 is in its natural state. Therefore, this resilient member for sliding 30 undergoes resilient deformation when the permanent magnet 18 has slid from the reference position B, and thereby biases this permanent magnet 18 in a direction to return to the reference position B.

This resilient member for sliding 30 also functions as a cover for ensuring that debris and the like from the opening 12 of the top plate 11 does not reach the top of the substrate 13. Note that the inner portion 31 of the resilient member for sliding 30 may be affixed to the key top 15 instead of the permanent magnet 18.

The resilient member for selection 35 has a circular shape when viewed from the perpendicular direction P. The outer diameter of the resilient member for selection 35 is substantially the same as the outer diameter of the key top 15 and the outer diameter of the permanent magnet 18. The resilient member for selection 35 has a ring-shaped attachment portion 36 that includes the outer circumference edge of this resilient member for selection 35, and a switch pressing portion 37 that is formed to the inside of this attachment portion 36. The switch pressing portion 37 projects in the direction in which the center axis of this resilient member for selection 35 extends (perpendicular direction), and is capable of undergoing resilient deformation in this direction. This resilient member for selection 35 is formed with a metal plate that is capable of undergoing resilient deformation.

The one surface (hereinbelow referred to as the upper surface) 36a of the attachment portion 36 is fixed via the attachment portion 36 of the resilient member for sliding 30 to the lower end surface 18b of the permanent magnet 18 so that the switch pressing portion 37 of the resilient member for selection 35 enters the inside of the ring of the permanent magnet 18 and faces the contact portion 16 of the key switch that is fixed to the permanent magnet 18.

As described above, the key top 15, the permanent magnet 18, and the resilient member for selection 35 are mutually affixed so as to be relatively immovable in the sliding direction H. Therefore, the key top 15, the permanent magnet 18, and the resilient member for selection 35 integrally move in the sliding direction H rather than mutually undergoing relative displacement.

The upper surface 13a of the substrate 13 faces the other surface (hereinbelow referred to as the lower surface) 36b of the attachment portion 36 of the resilient member for selection 35. Also, the upper surface 13a of the substrate 13 is in sliding contact with the lower surface 36b of the resilient member for selection 35 that slides accompanying sliding of the key top 15. That is to say, the upper surface 13a of the substrate 13 serves as a guide surface for sliding in the sliding direction H of the key top 15.

The cumulative thickness dimension in the perpendicular direction P of the support portion 17 of the key top 15, the permanent magnet 18, the inner portion 31 of the resilient member for sliding 30, and the attachment portion 36 of the resilient member for selection 35 is less than the gap dimension between the lower surface 11b of the top plate 11 and the upper surface 13a of the substrate 13. For this reason, in the state of the lower surface 36b of the resilient member for selection 35 making contact with the upper surface 13b of the substrate 13, there is a space between the upper surface of the support portion 17 of the key top 15 and the lower surface 11b of the top plate 11. Therefore, in this state, the key top 15 is capable of moving in a direction away from the substrate 13 in the perpendicular direction P.

Figure 3:
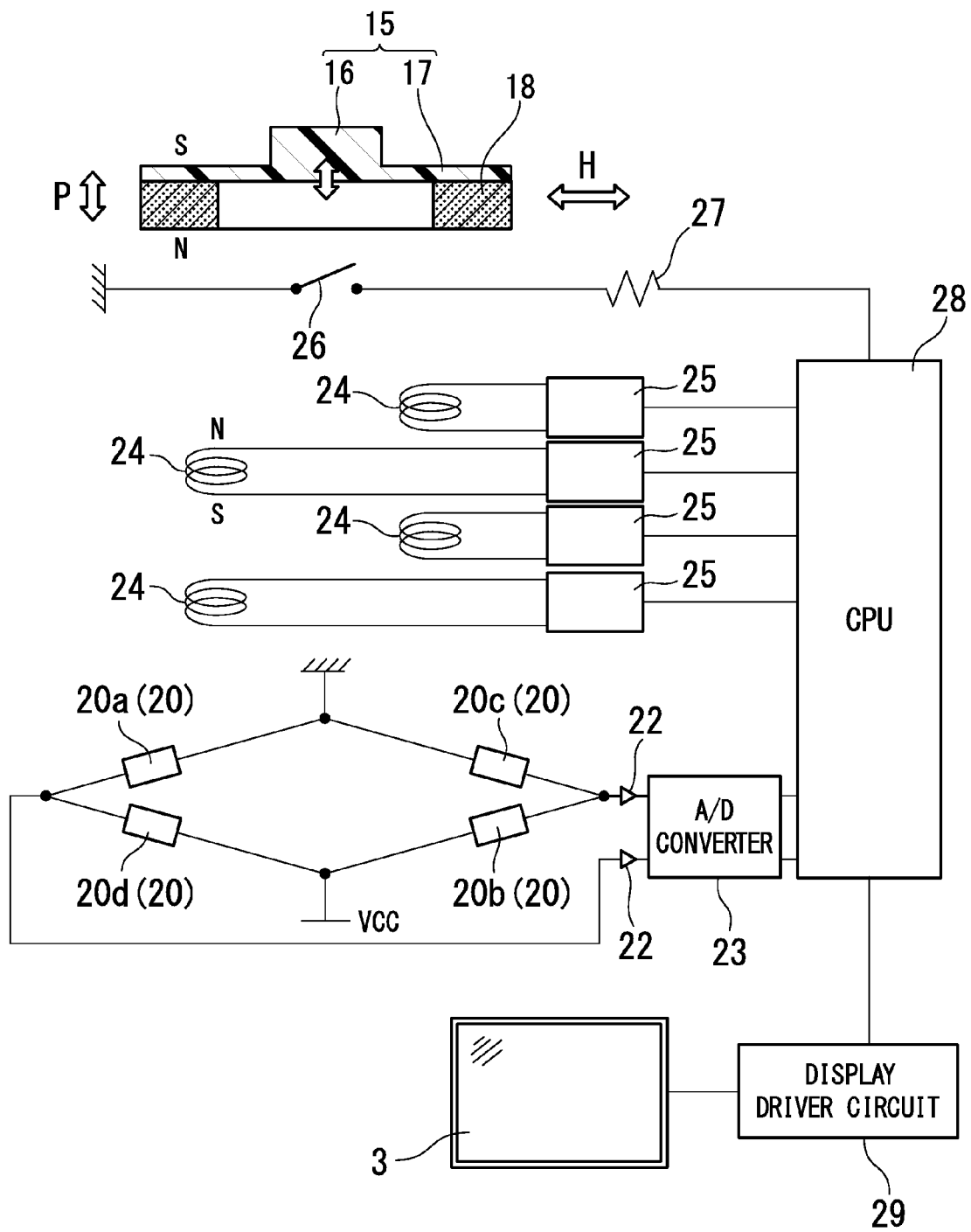
FIG. 3 is a schematic circuit diagram of the input device according to the exemplary embodiment of the present invention.

The pointing device 10, as shown in FIG. 3, further includes an A/D converter 23 that is connected to the four magnetic sensors 20, a coil driver circuit 25 that is provided for each of the four magnetic coils 24, and a CPU 28 that performs various arithmetic processes.

In the present exemplary embodiment, the magnetic sensor 20 is a Hall element that detects a magnetic field by the Hall effect, and outputs an analog signal proportional to the strength of the magnetic field that is detected. As shown in FIG. 2, among the four magnetic sensors 20, the pair of magnetic sensors 20a and 20b that face each other are called a first magnetic sensor 20a and a second magnetic sensor 20b. Also, the remaining pair of magnetic sensors 20c and 20d are respectively called a third magnetic sensor 20c and a fourth magnetic sensor 20d. The four magnetic sensors 20a, 20b, 20c and 20d, as shown in FIG. 3, are electrically connected in a bridge arrangement, and constitute a bridge circuit. A specific constitution is as follows. The first magnetic sensor 20a and the second magnetic sensor 20b are each connected to the third magnetic sensor 20c and the fourth magnetic sensor 20d. The connection of the first magnetic sensor 20a and the third magnetic sensor 20c is grounded. A power supply VCC is connected to the connection of the second magnetic sensor 20b and the fourth magnetic sensor 20d. Also, the connection of the second magnetic sensor 20b and the third magnetic sensor 20 and the connection of the fourth magnetic sensor 20d and the first magnetic sensor 20a are each connected to the A/D converter 23 via amplifiers 22.

The A/D converter 23 converts the analog signal from each magnetic sensor 20 to a digital signal, and outputs the converted signal to the CPU 28.

The four coil driver circuits 25 are respectively connected to the CPU 28. Each coil driver circuit 25 supplies electrical power in accordance with an instruction from this CPU 28 to a corresponding electromagnetic coil 24.

The decision switch 26 is connected with the CPU 28 via a resistor 27, and in accordance with opening and closing (ON/OFF) of the decision switch 26, a high signal or low signal is output to the CPU 28.

In addition to the above elements, the display 3, the keyboard 9 (refer to FIG. 5) and a communication device not illustrated are connected to the CPU 28. The display 3 is connected with the CPU 28 via a display driver circuit 29.

Next, the operation of the pointing device 10 described above shall be described with reference to FIGS. 4A to 4D.

Figure 4A:
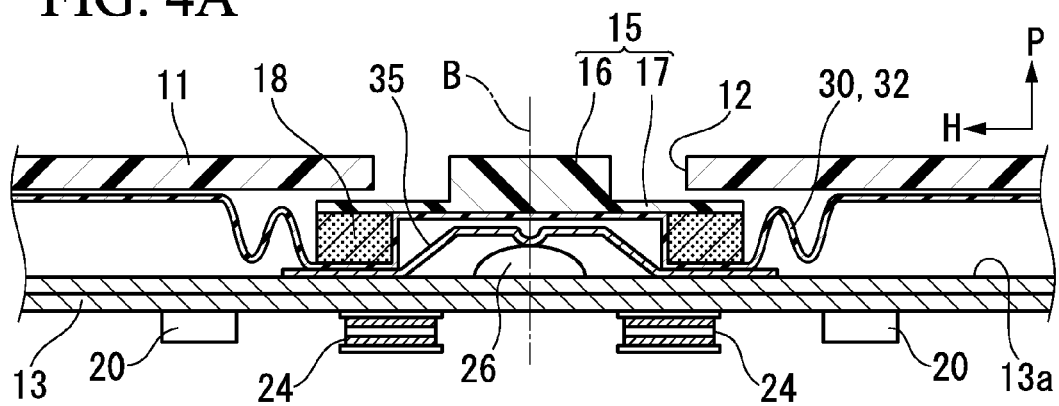
FIG. 4A is an operation explanatory diagram of the input device according to the exemplary embodiment of the present invention, showing a state of the key top being at a reference position.
Figure 4B:
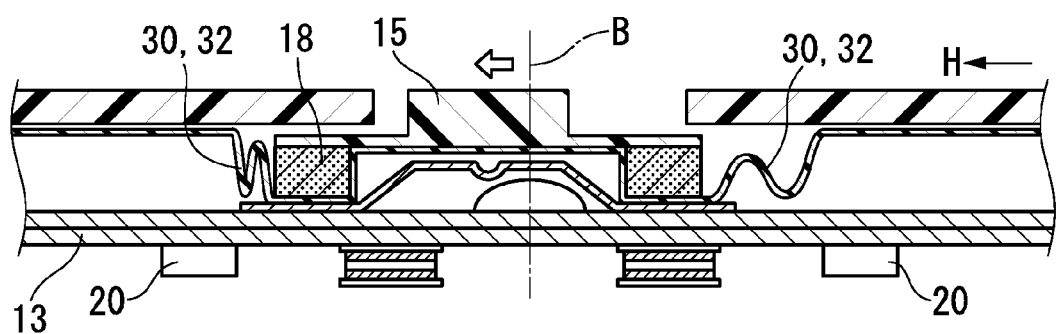
FIG. 4B is an operation explanatory diagram of the input device according to the exemplary embodiment of the present invention, showing a state of the key top having slid.

In the case of the pointer being shown on the display 3, when the operator causes the key top 15 that is over the reference position B to slide as shown in FIG. 4A and FIG. 4B, the permanent magnet 18 that is fixed to this key top 15 also slides together with the key top 15, and the resilient portion 32 of the resilient member for sliding 30 undergoes resilient deformation. When the permanent magnet 18 slides, the magnetic field that this permanent magnet 18 forms moves, and the strength of the magnetic field with respect to the magnetic sensors 20 changes. Each magnetic sensor 20 outputs an analog signal in accordance with the strength of this magnetic field. In other words, each magnetic sensor 20 outputs an analog signal in accordance with the position of the permanent magnet 18. The A/D converter 23 (refer to FIG. 3) converts the analog signal from each magnetic sensor 20 to a digital signal. The CPU 28, using this digital signal, finds the display coordinates of the pointer, creates a display control signal in accordance with the display coordinates, and outputs it to the display driver circuit 29. As a result, the position of the pointer on the display 3 changes in accordance with sliding of the key top 15.

After the operator slides the key top 15, when this key top 15 is released, the resilient portion 32 of the resilient member for sliding 30 that had undergone resilient deformation returns to its original natural state. Accompanying this, the key top 15 and the permanent magnet 18, as shown in FIG. 4A, return to over the reference position B. In the process of this key top 15 and the permanent magnet 18 returning to over the reference position B, the display position of the pointer does not change.

The case shall be described of some signal being input from the pointing device 10, the keyboard 9 or the like, and the CPU 28 judging the input of this signal to mean imparting a stimulation to the operator. In this case, the CPU 28 instructs each coil driver circuit 25 on electrical power to be supplied to the corresponding electromagnetic coil 24. Each coil driver circuit 25 supplies electrical power to its corresponding electromagnetic coil 24 in accordance with this instruction. As a result, electrical power is supplied to the electromagnetic coils 24 from the corresponding driver circuits 25, whereby the permanent magnet side of each electromagnetic coil 24 is excited to the N-pole.

Figure 4C:
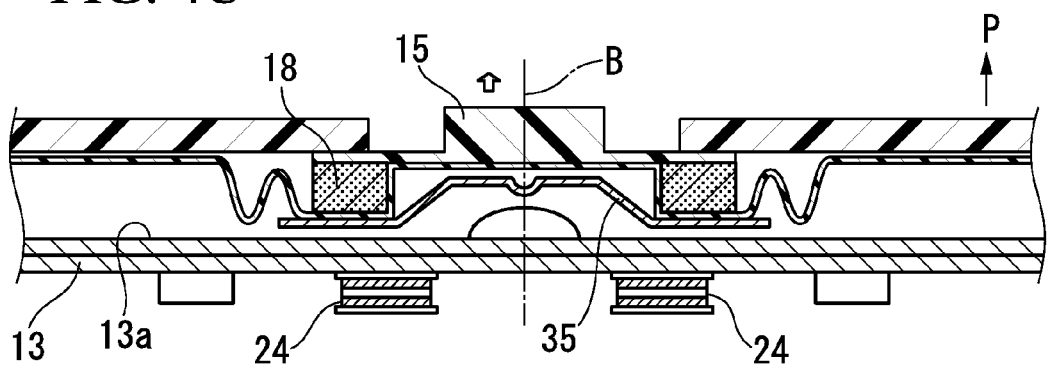
FIG. 4C is an operation explanatory diagram of the input device according to the exemplary embodiment of the present invention, showing a state of the key top having undergone a lift movement.

In the permanent magnet 18, as described above, the lower surface 18b side, that is to say, the electromagnetic coil side in the perpendicular direction P, is the N-pole. For that reason, when the permanent magnet side of each electromagnetic coil 24 becomes an N-pole, the permanent magnet 18 receives a repulsion force from each electromagnetic coil 24. Thereby, the permanent magnet 18 and the key top 15, as shown in FIG. 4A and FIG. 4C, undergo a lift movement in a direction of retreating from the substrate 13 in the perpendicular direction, and so impart a sensation to the operator that is touching the key top 15.

The case of the same amount of electrical power being supplied to each electromagnetic coil 24 when the ring-shaped magnet 18 and the key top 15 exist at the reference position B shall be described. In this case, since the permanent magnet 18 receives a repulsion of the same magnitude from each electromagnetic coil 24, the permanent magnet 18 and the key top 15 undergo a lift movement without changing their angle with respect to the substrate 13. Next, the case of mutually differing amounts of electrical power being supplied to the electromagnetic coils 24, or the case of electrical power being supplied to only some of the electromagnetic coils 24, when the ring-shaped magnet 18 and the key top 15 exist at the reference position B shall be described. In this case, since the permanent magnet 18 receives a repulsion of a different magnitude from each electromagnetic coil 24, the permanent magnet 18 and the key top 15 undergo a lift movement with their angle with respect to the substrate 13 changed, or only a portion of the permanent magnet 18 and the key top 15 undergo lift movement, that is to say, the permanent magnet 18 and the key top 15 tilt with respect to the substrate 13.

The case of the same amount of electrical power being supplied to each electromagnetic coil 24 when the ring-shaped magnet 18 and the key top 15 slide and so do not exist at the reference position B shall be described. In this case, since the permanent magnet 18 receives a repulsion of a different magnitude from each electromagnetic coil 24, the permanent magnet 18 and the key top 15 tilt with respect to the substrate 13. Next, the case of differing electrical power being supplied to each electromagnetic coil 24 when the ring-shaped magnet 18 and the key top 15 slide and so do not exist at the reference position B shall be described. In this case, by supplying a predetermined differing amount of electrical power to each electromagnetic coil 24 to cause the permanent magnet 18 to receive a repulsion of the same magnitude from each electromagnetic coil 24, it is possible to cause the permanent magnet 18 and the key top 15 to undergo a lift movement without changing their angle with respect to the substrate 13.

Therefore, in the present exemplary embodiment, in the case of a predetermined signal being input from the pointing device 10 or the like, in accordance with the position of the permanent magnet 18 at that time, and this predetermined signal, the amount of electrical power designated to each coil driver circuit 25 is changed, to cause the key top 15 to undergo lift movement without changing its angle with respect to the substrate 13, or cause the key top 15 to tilt in a predetermined orientation, thereby imparting various sensations to the operator.

After the key top 15 has undergone the lift movement, when the electrical supply to each electromagnetic coil 20 is cut, and the excitation of each electromagnetic coil 24 is released, the resilient portion 32 of the resilient member for sliding 30 that had undergone resilient deformation by the lift movement of the key top 15 returns to its natural state. As a result, as shown in FIG. 4A, the resilient member for selection 35, integrally with the key top 15 and the permanent magnet 18, makes contact with the upper surface 13a of the substrate 13, and the key top 15 returns to its original position.

Figure 4D:
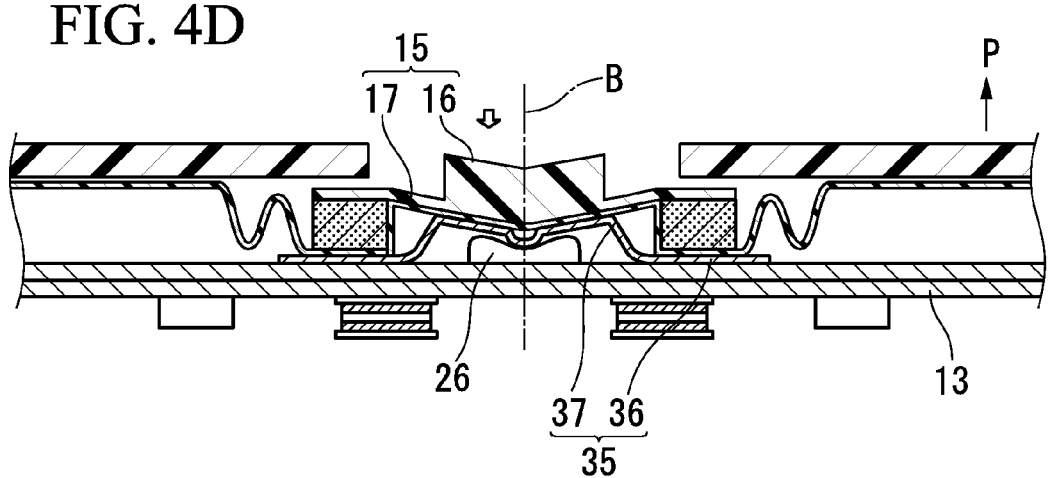
FIG. 4D is an operation explanatory diagram of the input device according to the exemplary embodiment of the present invention, showing a state of a decision switch having been pushed down by the key top.

As shown in FIG. 4A and FIG. 4D, when the key top 15 is at the reference position B, the operator strongly pushes the contact portion 16 of the key top 15 in opposition to the resilient force of the resilient member for selection 35, that is, this contact portion 16 is made to move in a direction approaching the substrate 13 in the perpendicular direction P. Thereby, the decision switch 26 is pushed by this contact portion 16 via the resilient member for selection 35, and enters the ON state, and a low signal is output from the decision switch 26. When the low signal is input from the decision switch 26, the CPU 28 grasps that the operator has selected or decided the item that the pointer is indicating at this time, and executes the process corresponding to this selection or decision.

As described above, with the pointing device of the present exemplary embodiment, it is possible to indicate the position of the pointer, and indicate the selection item or decision item, and it is possible to impart various stimulations to the operator.

Also, in the present exemplary embodiment, the movement of the key top 15 for position indication of the pointer is two-dimensional movement that is parallel to the substrate 13. Moreover, the magnetic sensors 20 and the electromagnetic coils 24 are arranged in a two-dimensional manner on the lower surface 13b of the substrate 13. For this reason, it is possible to reduce the thickness (dimension in the perpendicular direction P) of the pointing device 10.

When arranging the four magnetic sensors 20 and the four electromagnetic coils 24 on the lower surface 13b of the substrate 13, it is possible to arrange all of them on one circular circumference that is centered on the reference position B. In this case, among the four electromagnetic coils 24, when at least any of the electromagnetic coils 24 is excited, the magnetic sensor 20 that is adjacent to the excited electromagnetic coil 24 ends up detecting not only the magnetic field of the permanent magnet 18, but also the magnetic field of this electromagnetic coil 24. For this reason, in this case, when the electromagnetic coils 24 are excited, the CPU 28 can no longer accurately grasp the position of the permanent magnet 18 due to the effects of the output from the four magnetic sensors 20.

For this reason, in the present exemplary embodiment, as shown in FIG. 2, the four electromagnetic coils 24 are arranged on the second circumference C2, while the four magnetic sensors 20 are arranged on the first circumference C1 of a different diameter than the second circumference C2, at positions at which the directions from the reference position B do not overlap with any of the electromagnetic coils 24. With this constitution, a predetermined distance or greater is ensured from the electromagnetic coils 24 to any of the magnetic sensors 20, and so the magnetic field effects due to the electromagnetic coils 24 that the magnetic sensors 20 receive are suppressed to a minimum.

Also, it is preferable that the electromagnetic coils 24 produce a large repulsion to the permanent magnet 18 with the smallest possible electrical power supply. For this reason, in the present exemplary embodiment, the diameter of the second circumference C2 is made a diameter in which the four electromagnetic coils 24 that are fixed on this second circumference C2 overlap with the permanent magnet 18 of the reference position B in the perpendicular position P, to reduce the distance between the four electromagnetic coils 24 and the ring-shaped coil of the reference position B.

Also, in the case of the diameter of the first circumference C1 being larger than the outer diameter of the permanent magnet 18 as opposed to being smaller, during sliding of the permanent magnet 18, the output difference from the four magnetic sensors 20 that are arranged on this first circumference C1 increases. As a result, the CPU 28 can readily compute the position of the permanent magnet 18. For this reason, in the present exemplary embodiment, the diameter of this first circumference C1 is made larger than the diameter of the second circumference C2 and the outer diameter of the permanent magnet 18.

In the present exemplary embodiment, the key top 15 is provided to be capable of sliding in any direction that is parallel to the substrate 13. However, in the present exemplary embodiment, it is not limited to this constitution. For example, the key top 15 may be provided to be capable of sliding only in two directions that are mutually perpendicular and parallel to the substrate 13.

In the present exemplary embodiment, the number of the magnetic sensors 20 and the number of the electromagnetic coils 24 are both four. However, the present exemplary embodiment is not limited to this constitution. The number of the magnetic sensors 20 and the number of the electromagnetic coils 24 may be three or more. Moreover, there is no need for the number of the magnetic sensors 20 and the number of the electromagnetic coils 24 to be the same number.

In the present exemplary embodiment, the coil driver circuit 25 is provided for each of the plurality of electromagnetic coils 24. This is in order to control the strength of the magnetic field that each electromagnetic coil 24 is made to generate in accordance with the position of the permanent magnet 18 and the like. Accordingly, in the case of not carrying out such control, one coil driver circuit may be provided for the plurality of electromagnetic coils 24.

In the present exemplary embodiment, a Hall element is used as the magnetic sensor 20 for detecting the position of the permanent magnet 18. However, the present exemplary embodiment is not limited to this constitution. Provided it outputs a signal corresponding to the strength of the magnetic field, any element such as a magneto resistance effect element or a magnetic impedance element for example may be used. Moreover, in the present exemplary embodiment, as the electromagnetic converter that generates magnetic force by the input of electrical power, the electromagnetic coil 24 is used. However, the present exemplary embodiment is not limited to this constitution. Provided magnetic force is generated by the input of electrical power, any element such as a magneto resistance effect element for example may be used.

In the present exemplary embodiment, the one CPU 28 is in charge of the input of signals from the decision switch 26 and the magnetic sensors 20, and the output of control signals to the coil driver circuits 25 and the display driver circuit 29. However, the present exemplary embodiment is not limited to this constitution. Each input and each output may be assigned to an individual CPU.

This application is based upon and claims the benefit of priority from Japanese patent application No. 2010-192693, filed on Aug. 30, 2010, the disclosure of which is incorporated herein in its entirety by reference.

INDUSTRIAL APPLICABILITY

The present exemplary embodiment is an example applied to a mobile phone, but the present invention is not limited to this. The present invention may also be applied to any type of electronic apparatus such as a portable information processor or the like.

REFERENCE SYMBOLS

3 Display
10 Pointing device (input device)
11 Top plate
13 Substrate
15 Key top
16 Contact portion
17 Support portion
20 Magnetic sensor
24 Electromagnetic coil
25 Coil driver circuit
26 Decision switch
28 CPU
30 Resilient member for sliding
31 Inner portion
32 Resilient portion
33 Outer portion
35 Resilient member for selection
36 Attachment portion
37 Switch pressing portion

The invention claimed is:
1. An input device comprising:
a substrate that includes a first surface and a second surface on a opposite side of the first surface;
a key top that is arranged on a first surface side of the substrate, the key top sliding from a reference position on the substrate in a plurality of directions parallel to the substrate, the key top moving in a perpendicular direction with respect to the substrate;
a magnet that is fixed on a substrate side of the key top, and moves together with the key top;
a plurality of magnetic sensors that are fixed on the second surface of the substrate, the magnetic sensors being respectively arranged apart in different directions parallel to the substrate centered on the reference position, the magnetic sensors detecting a position of the magnet that moves accompanying sliding of the key top; and
a plurality of electromagnetic converters that are fixed on the second surface of the substrate, the electromagnetic converters being respectively arranged apart in different directions parallel to the substrate centered on the reference position, the electromagnetic converters being arranged at positions different from the magnetic sensors, the electromagnetic converters generating mag- netic force in a direction in which the magnet is away from the substrate in the perpendicular direction, in accordance with a supply of electrical power.

2. The input device according to claim 1, wherein:
the key top slides from the reference position on the substrate in any direction parallel to the substrate; and
the magnet is a ring-shaped magnet having a ring shape, and including a first end surface on which the key top is fixed and a second end surface that faces the substrate, with the reference position being a center of a ring when the key top exists at the reference position.

3. The input device according to claim 2, wherein:
the plurality of magnetic sensors are on the second surface of the substrate, and are fixed on a first circumference that is centered on the reference position; and
the plurality of electromagnetic converters are on the second surface of the substrate, and are fixed on a second circumference that is centered on the reference position, a diameter of a second circumference being different from a diameter of the first circumference.

4. The input device according to claim 3, wherein:
the diameter of the second circumference is set so that the plurality of electromagnetic converters overlap in the perpendicular direction with the ring-shaped magnet when the key top exists at the reference position; and
the diameter of the first circumference is greater than the diameter of the second circumference and an outer diameter of the ring-shaped magnet.

5. The input device according to claim 2, wherein:
the key top includes: a contact portion that the operator touches; and a support portion that is fixed to the first end surface of the ring-shaped magnet and supports the contact portion to be able to move into and out of a ring of the ring-shaped permanent magnet; and
the input device further includes a switch at the reference position on the first surface of the substrate, the switch outputting a signal in accordance with the contact portion moving into and out of the ring-shaped magnet.

6. The input device according to claim 1, further comprising:
a resilient member that biases the key top slid from the reference position in a direction of returning to the reference position.

7. The input device according to claim 2, further comprising:
a top plate that is arranged on the first surface side of the substrate, with a gap opened with the substrate; and
a resilient member that biases the key top slid from the reference position in a direction of returning to the reference position, wherein:
the ring-shaped magnet is arranged between the top plate and the substrate;
the top plate includes an opening portion provided at a part corresponding to the reference position on the substrate so that the key top is faced from outside; and
the resilient member includes an inner portion, a resilient portion formed on an outer side of the inner portion, and an outer portion formed on an outer side of the resilient portion, the inner portion is attached to the ring-shaped magnet or the key top, and the outer portion is attached to a part around the opening portion that is a part of the top plate.

8. The input device according to claim 1, comprising:
a drive circuit that supplies electrical power to each of the plurality of electromagnetic converters, and
an arithmetic circuit that is electrically connected with the driver circuit and the plurality of magnetic sensors, the arithmetic circuit instructing the drive circuit of the electrical power to be supplied to the plurality of electromagnetic converters, and calculating a coordinate of pointer that is shown on a display in accordance with outputs of the plurality of magnetic sensors.

9. An electronic apparatus comprising the input device according to claim 8, and the display.

10. An electronic apparatus comprising the input device according to claim 1.

* * * * *